(12) United States Patent
Belcher et al.

(10) Patent No.: US 7,797,143 B2
(45) Date of Patent: Sep. 14, 2010

(54) RIVER ASSESSMENT, MONITORING AND DESIGN SYSTEM

(75) Inventors: Brian J. Belcher, Lexington, KY (US); J. George Athanasakes, Louisville, KY (US)

(73) Assignee: FMSM Engineers, Inc., Louisville, KY (US)

(*) Notice: Subject to any disclaimer, the term of this patent is extended or adjusted under 35 U.S.C. 154(b) by 11 days.

(21) Appl. No.: 12/027,656

(22) Filed: Feb. 7, 2008

(65) Prior Publication Data

US 2008/0195362 A1 Aug. 14, 2008

Related U.S. Application Data

(63) Continuation of application No. 10/769,940, filed on Feb. 2, 2004, now Pat. No. 7,349,831.

(60) Provisional application No. 60/444,277, filed on Jan. 31, 2003.

(51) Int. Cl.
*G06G 7/50* (2006.01)
(52) U.S. Cl. .................. 703/9; 703/10; 702/11
(58) Field of Classification Search ............. 703/9, 703/10; 702/14, 16, 17, 11
See application file for complete search history.

(56) References Cited

U.S. PATENT DOCUMENTS

| 3,331,207 A | 7/1967 | McGrew et al. |
| 3,461,674 A | 8/1969 | Katzer et al. |
| 4,255,787 A | 3/1981 | Hoffmann et al. |
| 4,910,692 A | 3/1990 | Outram et al. |
| 5,160,216 A | 11/1992 | Takada et al. |
| 5,342,144 A | 8/1994 | McCarthy |
| 5,487,621 A | 1/1996 | Takada et al. |
| 5,531,125 A * | 7/1996 | Ahn et al. ............... 73/861.27 |
| 5,559,716 A | 9/1996 | Gaalswyk |
| 5,608,171 A | 3/1997 | Hunter et al. |
| 5,633,809 A | 5/1997 | Wissenbach et al. |
| 5,675,504 A | 10/1997 | Serodes et al. |
| 5,757,665 A | 5/1998 | Nestler et al. |
| 5,790,420 A | 8/1998 | Lang |
| 5,812,421 A | 9/1998 | Fujii et al. |
| 5,824,888 A | 10/1998 | Dhole |
| 5,913,179 A * | 6/1999 | Sutton et al. ............... 702/12 |
| 5,963,880 A | 10/1999 | Smith |
| 6,160,759 A | 12/2000 | Nestler et al. |

(Continued)

OTHER PUBLICATIONS

Belcher et al., "Natural Channel Design Process, Using Rivermorph Stream Restoration Software", NAAMLP Conference, Sep. 15-18, 2002, 7 pages.

(Continued)

*Primary Examiner*—Dwin M Craig
(74) *Attorney, Agent, or Firm*—Wood, Herron & Evans LLP

(57) ABSTRACT

A method, apparatus and program product to facilitate the analysis and monitoring of stream and river conditions, with emphasis on Natural Channel Design. To this end, the invention uses and processes channel data to provide analysis and monitoring information and optimized channel design information. The channel data is automatically accessed from a database that includes channel data derived from a plurality of geomorphological sources and user inputs. The channel data is located and otherwise determined in response to user input and is used to derive optimized channel design information. This channel design information may be used to implement specific preventive and restorative practices appropriate to realize stable and ecologically appropriate characteristics for a given target reach.

15 Claims, 11 Drawing Sheets

U.S. PATENT DOCUMENTS

| | | | |
|---|---|---|---|
| 6,178,393 | B1 | 1/2001 | Irvin |
| 6,278,949 | B1 * | 8/2001 | Alam .......................... 702/16 |
| 6,889,141 | B2 | 5/2005 | Li et al. |
| 7,107,285 | B2 | 9/2006 | von Kaenel et al. |
| 7,142,196 | B1 | 11/2006 | Connor et al. |

OTHER PUBLICATIONS

Rosgen, Dave, "The Reference Reach—a Blueprint for Natural Channel Design", Proceedings of the Wetlands and Restoration Conference, Denver, Colorado, Mar. 1998, 9 pages.

Frigeri et al., "Low Cost PDA/Gps Based Field Logging Solution for GRASS Data", Proceedings of the Open Source GIS-GRASS Users Conference, Sep. 11-13, 2002, 6 pages.

"Conference on the Emerging Science of Natural Channel Design", Program Schedule, Nov. 6-7, 2001, (http://www.ag.ohio-state.edu/~channel/index.html), 4 pages.

Ohio Department of Natural Resources, Division of Soil and Water Conservation, Stream Morphology Utilities, http://www.dnr.state.oh.us/soilandwater/streammorphology.htm, downloaded Jun. 7, 2004, 2 pages.

* cited by examiner

FIG. 7

RIVER ASSESSMENT, MONITORING AND DESIGN SYSTEM

CROSS-REFERENCE TO RELATED APPLICATION

The present application is a continuation of U.S. patent application Ser. No. 10/769,940, entitled RIVER ASSESSMENT, MONITORING AND DESIGN SYSTEM, filed on Feb. 2, 2004, the disclosure of which is hereby incorporated by reference in its entirety, which claims the filing benefit of U.S. Provisional Application Ser. No. 60/444,277, entitled RIVER RESTORATION SYSTEM, filed on Jan. 31, 2003, the disclosure of which is hereby incorporated by reference in its entirety.

FIELD OF THE INVENTION

The present invention relates generally to computer operations, and more particularly, to a computer implemented system for river analysis.

BACKGROUND OF THE INVENTION

The need for effective waterway planning and management continues to grow in the face of changing manmade and natural challenges. For instance, natural water flows are routinely dammed, redirected, caused to take on increased flow or otherwise altered by urban expansion. Absent corrective measures, such changes to existing river conditions can lead to flooding, fragmentation, nutrient disruption, erosion and other potentially destructive situations for dwellings and natural habitats. Professionals must consequently anticipate such changes and make physical adjustments to the channel width, banks, route, depth or other features of a stream or river to accommodate the new river conditions.

To this end, river professionals have developed formulas and spreadsheet applications for assessing and monitoring existing streams and rivers. Stored data pertaining to existing waterways can be useful in designing optimal dimensions for a disturbed (impacted) reach, or target stretch of water. Such data conventionally includes data collected on a river or stream within the boundaries defined by approximately 20-30 bankfull widths along the thalweg and the breadth of the floodprone area. A thalweg comprises a line connecting the deepest points along a channel, and bankfull generally regards a stream discharge value at a point where the river just fills the banks of a stream channel. Such design practices are generally categorized under a group of river restoration processes called Natural Channel Design.

Natural Channel Design incorporates naturally occurring stream processes during a restoration project to an extent that will allow the stream, itself, to stabilize and provide maximal biological potential. To this end, Natural Channel Design incorporates fluvial geomorphology as the basis for stream stabilization. Aspects of fluvial geomorphology include the interactions of climate, geology, topography, vegetation and land use within a given watershed. Natural Channel Design also makes allowances for the fact that rivers and streams support both aquatic and terrestrial ecosystems. The goal of Natural Channel Design is to provide a healthy habitat for aquatic organisms such as fish, amphibians, insects, mollusks and plants, while stabilizing the stream networks that provide food sources and migration routes for mammals and birds. That is, using undisturbed properly functioning sections of streams, or reference reaches as models promotes restoration solutions for stream channels that provide both physical stability and biological potential.

Despite the advancements to design processes realized by Natural Channel Design formulas and the electronic storage of existing river statistics, river design remains an arduous task. For example, accounting for all of the above listed geomorphological variables during the restoration of a stream presents a major challenge to Natural Channel Design. Namely, a conventional designer must accomplish the substantial task of retrieving the stored river data from numerous, decentralized sources in the course of a channel design process. Even where all of such data is accessible to the designer, it may take hours to amass the data required to finish the design.

In a specific example, a user attempting to accomplish a design for an impact reach must manually measure reach data, such as the cross-sectional dimensions of a stretch of the impact reach. The user then records the reach data in a log book, the entries of which the user will later apply in formulas in order to arrive at a design feature. Often, the formulas require additional data from multiple reference books and/or government databases, such as reference reach data or regional curves. The formulas, themselves, must be routinely looked up in another book or other source before the user can begin to manually enter numbers into a calculator to solve the requisite equations. In any case, convention design processes burden professionals with locating and updating data from numerous different sources.

While conventional spreadsheets and databases can help with the efficiency of certain aspects of a design process, such as copying data, conventional tools still require a user to manually calculate and visualize aspects of a channel design. Such tedious practices associated with manually evaluating large amounts of data and program results can slow and otherwise complicate design processes. Furthermore, the decentralized sources, results and incompatible formats of compiled data and tools used in conventional design processes can frustrate comprehensive analysis of channel design. As such, an abundance of available data and calculations can ironically overwhelm a planner, contribute to inefficiency and ultimately lead to an inferior design.

Consequently, and for in part the above delineated reasons, there exists a need for an improved manner of analyzing, designing and otherwise managing river features.

SUMMARY OF THE INVENTION

The present invention provides an improved apparatus, method and program product for analyzing, monitoring and designing stream and river conditions. The present invention has particular application in enabling stream assessments, stream monitoring and Natural Channel Design. Natural Channel Design generally regards using a stable reach of water as a reference for designing features of an impacted stream reach. This practice generally yields designs that exhibit the most stable and ecologically appropriate characteristics for a given target reach. To this end, the invention processes channel data to provide optimized channel design information. The channel data is automatically accessed from a database that includes channel data derived from a plurality of geomorphological sources. The channel data is located and otherwise determined in response to user input requesting the optimized channel design information.

The optimized channel design information typically comprises graphics and text that define dimensions, composition and other characteristics of a channel design best suited for the target reach. For example, the optimized channel design information output to a user may include the optimized flow, sediment, biological and stability characteristics for the target reach. Other channel design information may include predictions useful in anticipating future river conditions and pre-empting potential problem areas of a river.

The channel design information may be used as a model by a user who can implement specific preventive and restorative practices appropriate to realize the channel design at the target reach. In that sense, an embodiment of the invention may use a reference reach, along with existing reach data in empirical formulas to automatically generate a detailed description of the designed reach, including its stream classification and the geometry of its meander pattern.

More particularly, channel design information consistent with the invention may be based on channel data from both the impact and a reference reach of a river. The reference reach of a river may correspond to a portion of the river having characteristics desirable for the impact reach of the river. Inclusion of data derived from the reference reach in the software processing promotes river continuity and natural processes. Exemplary channel measurement data includes, among other inputs: cross-sectional geometry, thalweg/water surface and bankfull slope (profile data), pool spacing, bank height, sediment deposition, particle composition and bend frequency. Other applicable channel data may include bar forming occurrences, vegetation data, fish population statistics, erosion indicators and water quality. Such data may be typed, downloaded or be otherwise entered into the database.

The configuration of the database facilitates river analysis by providing comprehensive data access for engineers and automated calculation tools. Such access enables data to be transparently drawn from the database, obviating the need for a user to re-enter data. To this end, the software may include a graphical user interface (GUI) that links to the data within the database and allows the user to graphically manipulate the data. An exemplary GUI link may include a pointer to Geographic Information System (GIS) digital maps that allow direct measurements of geomorphic features. Capitalizing on GIS features, a user may exploit the maps to measure reach width, radius of curvature, meander wavelength and sinuosity of the target, or impact reach.

By virtue of the foregoing there is thus provided an improved river analysis and monitoring system that addresses above-identified shortcomings of known river planning practices. In so doing, the invention provides a comprehensive and accessible resource of stored data and tools useful to environmental professionals. These and other objects and advantages of the present invention shall be made apparent from the accompanying drawing and the description thereof.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the principles of the invention.

FIG. 7 is a browser window configured to prompt data used to determine boundary conditions of an impact reach according to the processes of the flowchart of FIG. 4.

DETAILED DESCRIPTION

Figure 1:
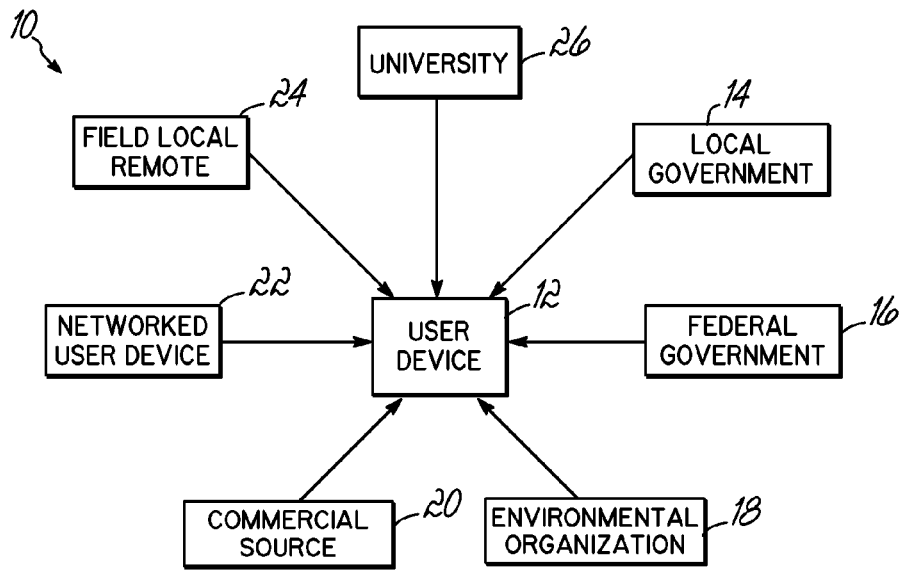
FIG. 1 is a block diagram of a networked computer system configured to retrieve and process channel data to determine channel design information.

With reference generally to the embodiment of FIG. 1, there is shown a computer system 10 configured to analyze and monitor stream and river conditions, with emphasis on Natural Channel Design. To this end, the system 10 processes measurements, applicable formulas and other channel measurement data to provide graphics, text and other design information that defines the dimensions, composition and other characteristics best suited for a target, or impact, reach of a river or stream. For instance, channel design information determined by the system 10 may provide optimized flow, sediment, biological and stability characteristic for the target reach. This channel design information may be used as a blueprint for implementing specific preventive and restorative practices appropriate to realize the channel design feature at the impact reach.

Turning more particularly to FIG. 1, the system 10 includes at least one apparatus, e.g., such as user computer 12. The computer 12 at least initially receives channel data communicated from various source computers 14, 16, 18, 20, 22, 24 and 26 or by direct data entry. For the purposes of the invention, each computer 12, 14, 16, 18, 20, 22, 24 and 26 may represent practically any type of computer, computer system or other programmable electronic device capable of communicating channel data. For instance, computer 12 may include a portable device, such as a laptop or a handheld Personal Assistant Device. Moreover, each computer 12, 14, 16, 18, 20, 22, 24 and 26 may be implemented using one or more networked computers, e.g., in a distributed computing system. The communication of the channel data may be accomplished via the Internet, an intranet, an ethernet, direct cabling, or some other network connection, to include wireless reception.

Exemplary channel data communicated from the sources 14, 16, 18, 20, 22, 24 and 26, or by direct data entry, or otherwise stored at the user computer 12 may be derived from geomorphological studies, theories and equations, as well as from references retrieved from remote databases. Channel data formats may include digital text, audio, streaming video, photographs, binary, machine language and text. One embodiment consistent with the invention may provide additional benefit to a planner by processing all channel data to ensure compatibility between respective formats of data ultimately used for the design.

Figure 2:
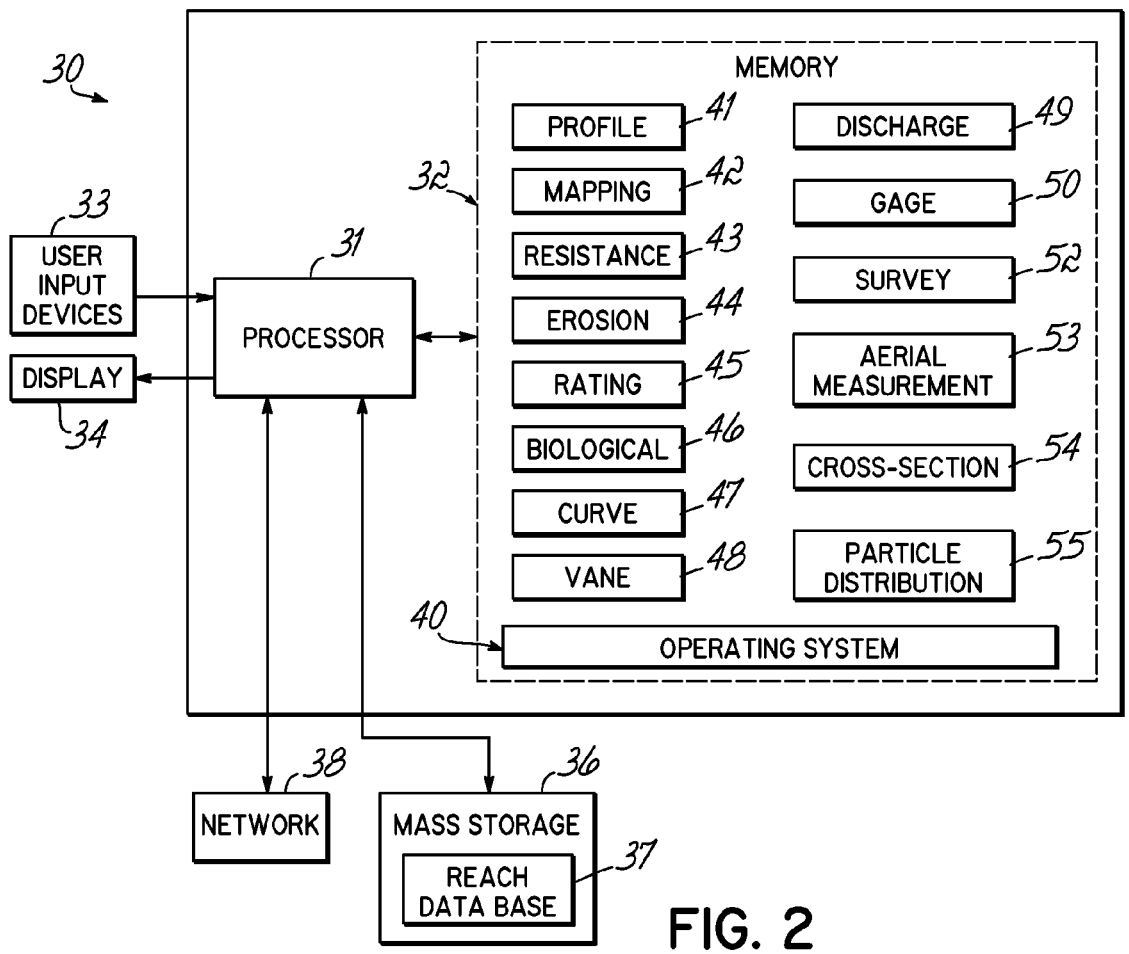
FIG. 2 is a block diagram of an exemplary hardware and software environment for a computer in the networked computer system of FIG. 1.

FIG. 2 is a block diagram of an embodiment of a hardware and software environment for a computer analogous to the user computer 12 of the networked computer system of FIG. 1. For the purposes of this specification, apparatus 30 may represent a computer, such as a laptop or a handheld Personal Assistant Device, computer system or other programmable electronic device, including a client, server or portable computer, an embedded controller, etc. In any case, while apparatus 30 will hereinafter also be referred to as a "computer," it should be appreciated the term "apparatus" may also include other suitable programmable electronic devices consistent with the invention.

Computer 30 typically includes at least one processor 31 coupled to a memory 32. Processor 31 may represent one or more processors (e.g., microprocessors), and memory 32 may represent the random access memory (RAM) devices comprising the main storage of computer 30, as well as any supplemental levels of memory, e.g., cache memories, non-volatile or backup memories (e.g., programmable or flash memories), read-only memories, etc. In addition, memory 32 may be considered to include memory storage physically located elsewhere in computer 30, e.g., any cache memory in a processor 31, as well as any storage capacity used as a virtual memory, e.g., as stored within a reach database 37 or on another computer coupled to computer 30 via network 38.

Computer 30 also may receive a number of inputs and outputs for communicating information externally. For interface with a user, computer 30 typically includes one or more input devices 33 (e.g., a keyboard, a mouse, a trackball, a joystick, a touchpad, and/or a microphone, among others) and a display 34 (e.g., a CRT monitor, an LCD display panel, and/or a speaker, among others). It should be appreciated, however, that with some implementations of computer 30, e.g., some server implementations, direct user input and output may not be supported by the computer, and interface with the computer may be implemented through client computer or workstation networked with computer 30.

For additional storage, computer 30 may also include one or more mass storage devices 36 configured to store the reach database 37. Exemplary devices 36 may include: a floppy or other removable disk drive, a hard disk drive, a direct access storage device (DASD), an optical drive (e.g., a CD drive, a DVD drive, etc.), and/or a tape drive, among others. Furthermore, computer 30 may include an interface with one or more networks 38 (e.g., a LAN, a WAN, a wireless network, and/or the Internet, among others) to permit the communication of information with other computers coupled to the network. It should be appreciated that computer 30 typically includes suitable analog and/or digital interfaces between processor 31 and each of components 32, 33, 34, 36 and 38.

Computer 30 operates under the control of an operating system 40, and executes various computer software applications, components, programs, objects, modules, etc. For instance, the embodiment of FIG. 2 includes program code configured to, at least in part, assist in river design, monitoring, assessment and restoration. Such program code may include any number of subprograms, routines and computing tools. Such program code may be updated, removed, added and/or augmented to reflect new design and industry practices. As such, channel data for purposes of this specification includes program code, which may be remotely retrieved and stored locally for execution along with other channel data, such as reach measurements.

More specifically, channel data comprising the program code may include a profile program 41 that automatically determines or enables the user to determine average reach, riffle, run, glide and pool slopes, depths and lengths of features using entered channel data according to commonly accepted practices. As shown in FIG. 2, the operating system 40 is also configured to execute an interactive mapping program 42, such as a Geographic Information System (GIS).

The operating system 40 shown in FIG. 2 additionally executes resistance programs 43 that include known variables and methods associated with Manning's equation, the Cowan, Chezy and/or Darcy-Weisbach equations, as well as those based on standard pipe flow equations or additional equation accepted by the industry to determine velocity and discharge. A bank erosion hazard tool 44 automatically determines erosion rates from field assessments using studies and/or formulas retrieved from the database 37 or another source. Such a determination process may use a published curve prepared by the United States Park Service, for instance. A Pfankuch channel rating or assessment program 45 retrieves data and determines an overall reach condition. The Pfankuch channel stability rating method is described in "Stream Reach Inventory and Channel Stability Evolution—a Watershed Management Procedure," published by the United States Forest Service. A channel stability and biological assessment program 46 processes stored channel data in the database 37 to determine a number of channel stability or biological conditions known and used by those skilled in the art to evaluate the ecological status of a reach.

A regional curve program 47 of FIG. 2 helps validate a natural channel design. For instance, the regional curve program may already contain or initiate the download of a number of industry accepted regional curves. Such curves may be stored within the database 37 and be made available to the user in a drop down menu or displayed graphically, for instance. Other curves may include locally collected and developed regional curves. Such data may be automatically entered into a table that may be edited. An embodiment of the invention may also create new curves from data entered into the table and by clicking data into a graph. The regional curve program 47 then evaluates the curve equation and statistical parameters to determine the quality of a fitted curve. The use of regional curves is known in the art and described in "Water in Environmental Planning" (1978) by Dunne and Leopold, which is available from the United States Geological Service.

A vane design program 48 determines vane length and spacing as a function of bankfull width, radius of curvature and vane departure angle. The vane design program 48 also determines a minimum rock size for vane construction as a function of shear stress and the minimum spacing between vanes as a function of channel slope. The vane design tool 48 enables the user to quickly calculate vane length and spacing as a function of bankfull width, radius of curvature and vane departure angle. A peak discharge program 49 determines runoff from rainfall and watershed conditions using equations developed by the National Resource Conservation Service. A gage analysis program 50 processes retrieved data and equations commonly accepted and known within the industry to determine discharge for a variety of return intervals. Such a determination facilitates flood frequency analysis and hydraulic geometry plotting, as well as regional curve creation.

A survey program 52 processes survey channel data using known differential leveling and total station data techniques. An aerial measurement program 53 serves as a link to GIS data by allowing direct measurements of a number of geomorphic features using aerial mapping, CAD drawings, digital images or shape files. Such interaction with GIS data may be near real time. A cross-section program 54 accesses stored cross-section data and processes it according to commonly accepted surveying practices to determine cross-sectional area, bankfull width, bankfull depth, other bankfull properties, and hydraulic geometry, for instance, using existing data, formulas such as the resistance programs 43 and sediment transport equations. Cross-section program 54 also allows the user to quickly determine bankfull features by dragging a line graphically through the use of a mouse, stylus or other device. A particle size distribution program 55 determines the particle size distribution of bed materials using user entered data or data retrieved from the database 37 or another source. The determination may be based on the Wolman pebble count method or from commonly accepted particles size analysis procedures, as are known in the art.

Though not explicitly shown in FIG. 2, one skilled in the art will appreciate that embodiments consistent with the invention may comprise additional programs as needed, to include equations to predict channel geometries as a function of known parameters, a velocity determination program, pipe dimension and placement determination programs, as well as a dimensionless ratio program and Rosgen Classification System program, among others. Moreover, various applications, components, programs, objects, modules, etc. may also execute on one or more processors in another computer coupled to computer 30 via a network 38, e.g., in a distributed or client-server computing environment, whereby the processing required to implement the functions of a computer program may be allocated to multiple computers over a network.

In general, the routines executed to implement the embodiments of the invention, whether implemented as part of an operating system or a specific application, component, program, object, module or sequence of instructions will be referred to herein as "computer programs," or simply "programs." The computer programs typically comprise one or more instructions that are resident at various times in various computer memory and storage devices. When a program is read and executed by a processor, the program causes the computer to execute steps or elements embodying the various aspects of the invention.

Moreover, while the invention has and hereinafter will be described in the context of fully functioning computers and computer systems, those skilled in the art will appreciate that the various embodiments of the invention are capable of being distributed as a program product in a variety of forms, and that the invention applies equally regardless of the particular type of signal bearing media used to actually carry out the distribution. Examples of signal bearing media include but are not limited to recordable type media such as volatile and non-volatile memory devices, floppy and other removable disks, hard disk drives, optical disks (e.g., CD-ROM's, DVD's, etc.), among others, and transmission type media such as digital and analog communication links.

In addition, various programs described hereinafter may be identified based upon the application for which they are implemented in a specific embodiment of the invention. However, it should be appreciated that any particular program nomenclature included herein is used merely for convenience, and thus the invention should not be limited to use solely in any specific application identified and/or implied by such nomenclature.

Those skilled in the art will recognize that the exemplary environments illustrated in FIGS. 1 and 2 are not intended to limit the present invention. Indeed, those skilled in the art will recognize that other alternative hardware and/or software environments may be used without departing from the scope of the invention. For instance, the manner in which data is organized, stored and otherwise processed within the system 10 may vary from one embodiment to another depending on different user and system requirements. In this vein, FIG. 3 shows one exemplary embodiment of a database schematic 60 that is consistent with the invention.

Figure 3:
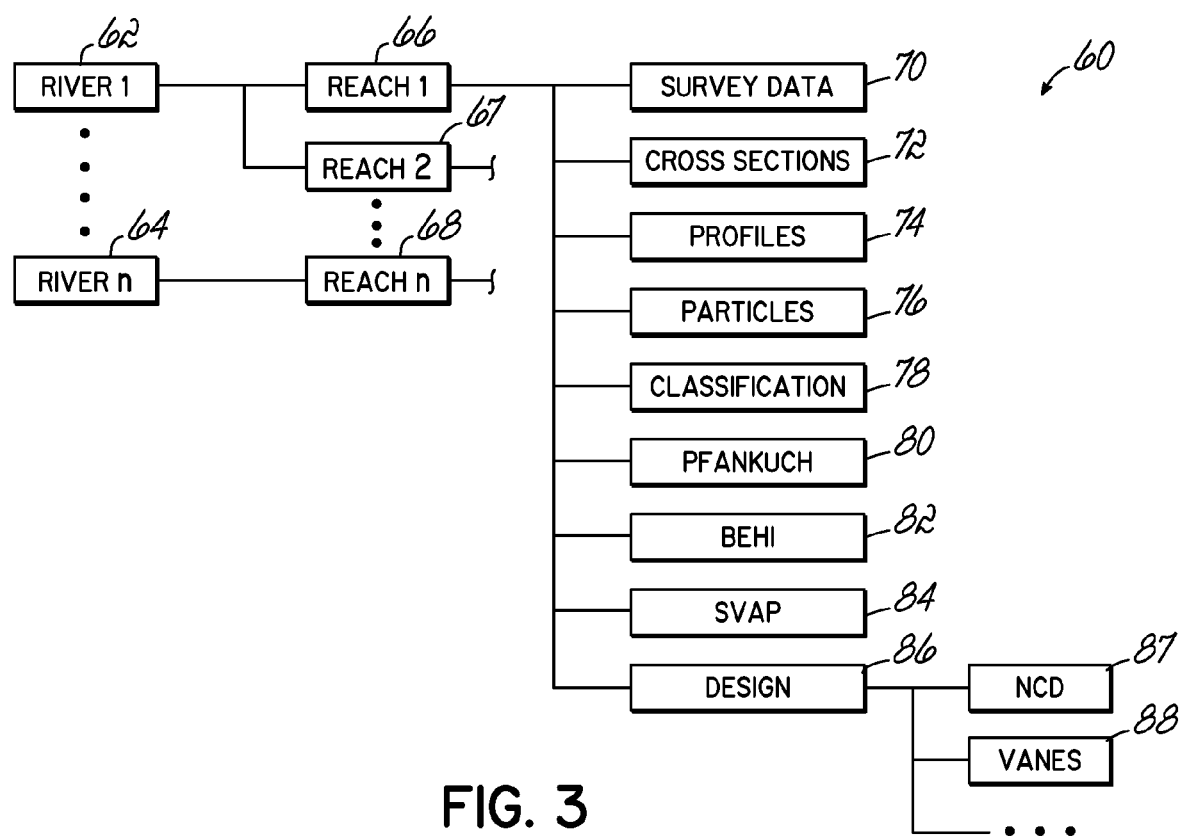
FIG. 3 is a schematic diagram of a database analogous to the database shown in FIG. 2.

More particularly, the database schematic diagram 60 of FIG. 3, which is analogous to the reach database 37 of FIG. 2, provides channel data that includes reach measurements, programmatic assessments and design/evaluative programs. Because the diagram 60 has particular application in the context of design assessment and monitoring processes, the system 30 may store all geomorphic data in a central location that includes the database 37. This centralized feature facilitates the development of reference reach data, regional curves and stream related data and provides a medium through which geomorphically derived data is shared by networked professionals. The flexible structure of the diagram 60 further allows easy inclusion and updating of subsequent channel data, including measurements and programs, to reflect changes in the current practices of determining channel information. The format of the channel data stored within the database may include text, machine code, audio, digital images and streaming video for user display and reference.

As shown in the FIG. 3, the operating system 40 organizes channel data in logical association with one or more river names. New rivers may be manually or automatically added and stored in association with the river. River data may subsequently be updated manually or automatically. For example, a browser function of the system 30 allows the download of remotely available data, such as is available from a remote government data source or other data source. Other updates may occur transparently to the user, for instance, at regular timed intervals. As such, a user seeking survey data of a particular creek may only have to click on a list displaying the name of that creek to have a menu of channel data, including survey data, displayed on the monitor. For instance, clicking or otherwise selecting a river name displayed in a list may prompt the display of one or more reach data fields 66, 67 associated with a field 62 that corresponds to that river. Selection of a reach field 66, in turn, may initiate the display of further compartmentalized data associated with the selected reach field 66. For example, selection of a particular reach field 66 may display relevant survey, cross-sectional, profile and particle data for that reach. Where desired, a field 70, 72, 74 and 76 corresponding to each of these respective headings may further be selected to cause the display of more detailed data associated with the respective data heading.

To this end, subordinate heading names displayed to a user via the GUI may be highlighted, italicized or colored to indicate to the user whether there is further detailed information associated with that particular heading. As such, the structure of the database allows a user to selectively access needed data in an organized and efficient manner. That is, the user can easily navigate through and access only that information that they need.

As discussed herein, the database may store industry accepted programs, values and equations, while allowing a user to create and/or input new channel data. For instance, such channel data may include regime equations known in the art. More particularly, the database may store a number of commonly used dimensionless ratios. Such ratios may be utilized when designing streams based on the reference reach method. Dimensionless ratios include standard measurements that are divided by a known measurement, such as a bankfull depth, for instance. This dimensionless parameter is then multiplied by a reach-specific bankfull depth or other parameters. The reference reach measurements are then applied to the design of an impact reach. The use of dimensionless ratios in the field of hydrology/hydraulics is known in the art.

Turning more particularly to FIG. 3, each field 62 and 64 of the schematic diagram 60 includes channel data that pertains to a river. For instance, a river field 62 typically includes the name of a particular river for ease of reference. Specific stretches of that river are stored in associated reach fields 66 and 67. That is, channel data particular to a reach 66 is stored in logical association with the river named in field 62. For instance, a survey data field 70 may include a permanent record of field book data associated with the river of field 62. Such survey data may be entered in multiple formats, including leveling and/or total station formats as are known in the art. For example, a user may manually enter weather, temperature, date, personnel identification and other records into the database. In another instance, a user may click on a date displayed on a calendar on a user's monitor display. The date may then be automatically caused to populate a field 70 stored in association with the reach field 66.

A cross-section field 72 includes data pertaining to the cross-section of the reach in reach field 66. Profile data pertinent to the reach is stored in a profile field 74, and a particle field 76 stores channel data relating to the size of sediment particles in the particular reach of the river. As such, a user may manually input or initiate the download of data pertaining to the total number of pebbles that fall within a given range. For instance, the size of the largest particle measured or stored in association with a reach may be stored in the database. Selection of sieve sizes may be selected, for instance, by using a pulldown menu of the GUI.

A classification field 78 may include the type of the associated reach, as categorized according to known processes. A Pfankuch field 80 may be used to further determine the stability rating of an applicable reach, as may a Bank Erosion Hazard Index (BEHI) field 82 and a Stream Visual Assessment Protocol (SVAP) field 84. As discussed in greater detail below, a design field 86 includes channel data that is particularly useful in determining a design information. As with any of the fields 62-88 shown in FIG. 3, the design field 86 may further be logically associated with additional channel data fields, such as Natural Channel Design (NCD) field 87 and vane design field 88.

Though not shown in the exemplary schematic diagram 60, one skilled in the art will appreciate that any number of other fields corresponding to other channel data may additionally and/or alternatively be included. For instance, the operating system 40 may similarly access data and equations stored in the database to determine sediment transport competency measurements, or other data and equations used to relate the processes through which sediment moves through a river system.

Figure 4:
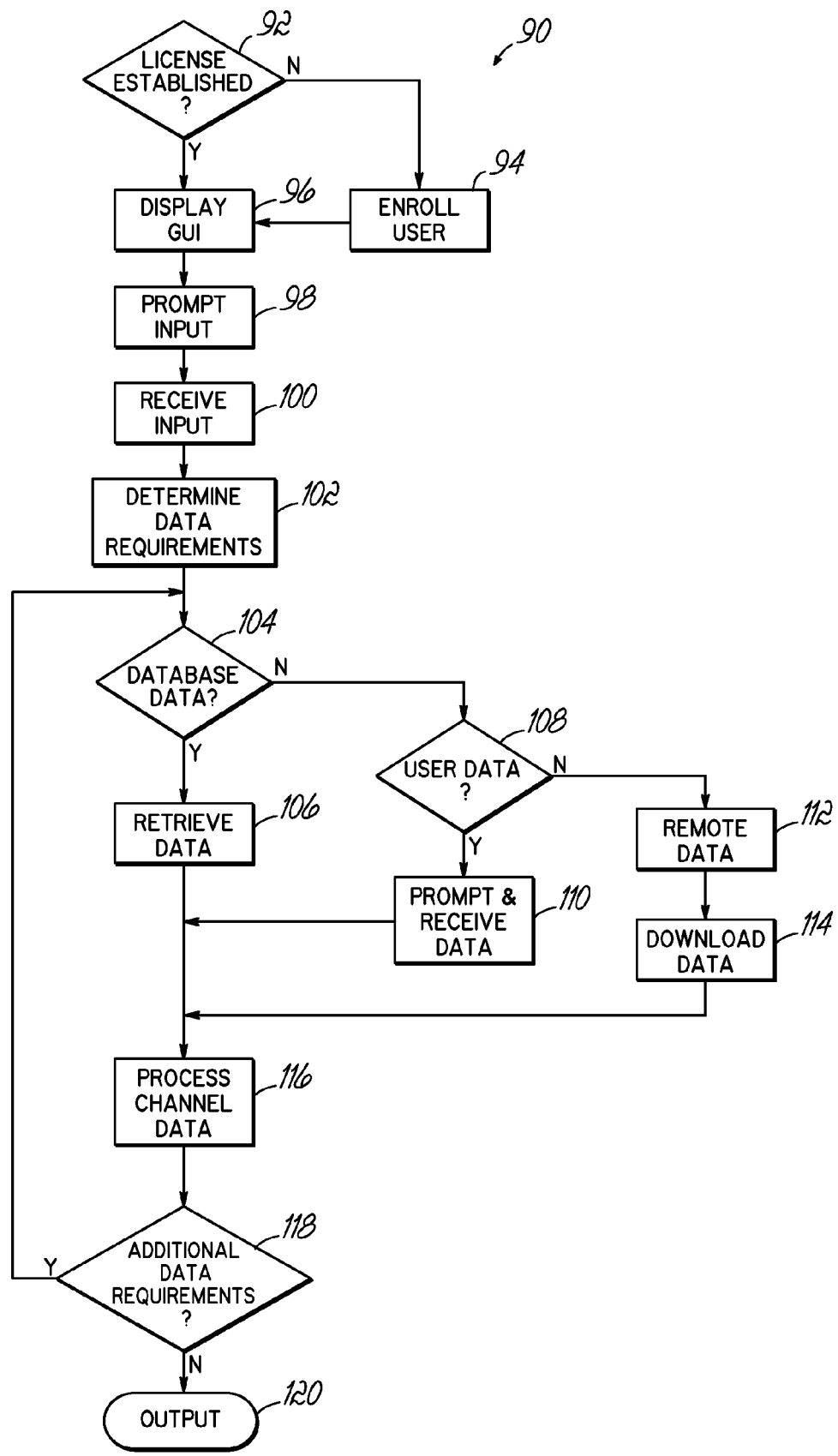
FIG. 4 is a flowchart including steps executed by the computer of FIG. 2 to determine channel design information.

FIG. 4 shows a flowchart 90 that includes steps configured to determine channel design information. The exemplary steps are executable by the hardware and software systems of FIGS. 1 and 2. For instance, the user computer 30 of FIG. 2 may initially execute block 92 of the flowchart 90 to verify that a user is properly licensed. Where no such license agreement has been established at block 92 of FIG. 4, the operating system 40 of the computer 30 may initiate enrollment of the user at block 94. License transfer steps associated with such enrollment at block 94 may include communicating a site code from the user's computer 30 to a networked source computer. That source computer may then process the site code along with an initiation code to result in the display of the GUI or may generate a new initiation code to allow the user to transfer the license to a new computer. The new initiation code may be communicated back to the user's computer, where it is entered. Verification of the initialization code may cause a GUI or browser to appear on the user's computer allowing access to source information, such as a database or a website.

Presuming the user has been properly licensed at block 96 of the flowchart 90 of FIG. 4, the operating system 40 displays a graphical user interface (GUI) to the user. An exemplary GUI is shown and discussed in greater detail below in describing FIG. 5. In one respect, the GUI prompts input from the user at block 98 of FIG. 4. Such input includes a request to obtain channel design information, such as cross-sectional data for a target reach.

After receiving the user input at block 100, the operating system 40 of the computer 30 may determine channel data requirements at block 102. For example, the operating system 40 may reference a list stored in the database to see what fields are required to determine the information requested at block 98 of FIG. 4. Once the location of applicable data is determined at block 104, for instance, the appropriate channel data may be retrieved from the database 37 at block 106. For example, a request for a discharge or velocity of an impact reach may prompt retrieval of an appropriate equation at block 106 from the memory of the computer 30.

The operating system 40 may alternatively and/or additionally require manually entered data from the user at block 108. As such, the operating system 40 may prompt and receive data at block 110. Where applicable, such data may be entered directly into the user computer 30 or be downloaded from another portable device employed by the user to enter the data at the river site. For instance, the operating system 40 may prompt the user to submit gage and/or discharge measurements taken from the impact stream. Thus, the operating system 40 causes the user to manually enter the data at block 110 of FIG. 4. Still other required data may be downloaded from remote sources at blocks 112 and 114. For example, the operating system 40 may retrieve existing reach data from a government remote website at block 114. An embodiment loads the existing reach data into the appropriate fields. The user may then modify the data as necessary to reflect design particulars.

Irrespective of how the data is received, the channel data is processed by the computer 30 at block 116. Such processing may comprise initially verifying that all the data needed to complete the request of the user is available. Processing at block 116 may also include the automatic execution of applicable programs executed by the operating system 40. Where necessary, some such processes may require additional data at block 118. As such, the additional data is subsequently or concurrently processed to determine needed channel information. That is, input received at block 100 of FIG. 4 may require multiple determinations that require additional channel data and processing prior to outputting the channel design information at block 120.

An embodiment consistent with the invention provides a user intuitive graphical user interface (GUI) to process geomorphic information related to channel measurements, assessments and design. The GUI links to the database 37 that stores programmatic tools and values useful for determining a number of geomorphic values and relationships that comprise channel design information. To this end, the GUI may include one or more toolbars that allow a user to quickly navigate between data associated with given rivers and reaches. The toolbar may include icons, browsers and other links to data and tools. For example, a toolbar may include links to reach profile particle and cross-section data. Other links may point to survey data, reach, GIS, erosion hazard index data, visual stream assessment protocol data, as well as Natural Channel Design and regional curve data. Tools and other programs available to the user via the toolbar may include resistance and regime equations, as well as stored regional curves. Such curves may have application in determining relationships of discharge, area, width and depth versus drainage area that is consistent with desired, natural streams in the same geographic area. An embodiment of the GUI may also include GIS features. Included in the GIS are components for adding, removing, zooming, selecting and identifying geomorphic features and graphics. A GIS may also include tools for measuring thalweg, radius of curvature, sinuosity and meander wavelength of a particular reach as well as other industry accepted geomorphic measurements.

Figure 5:
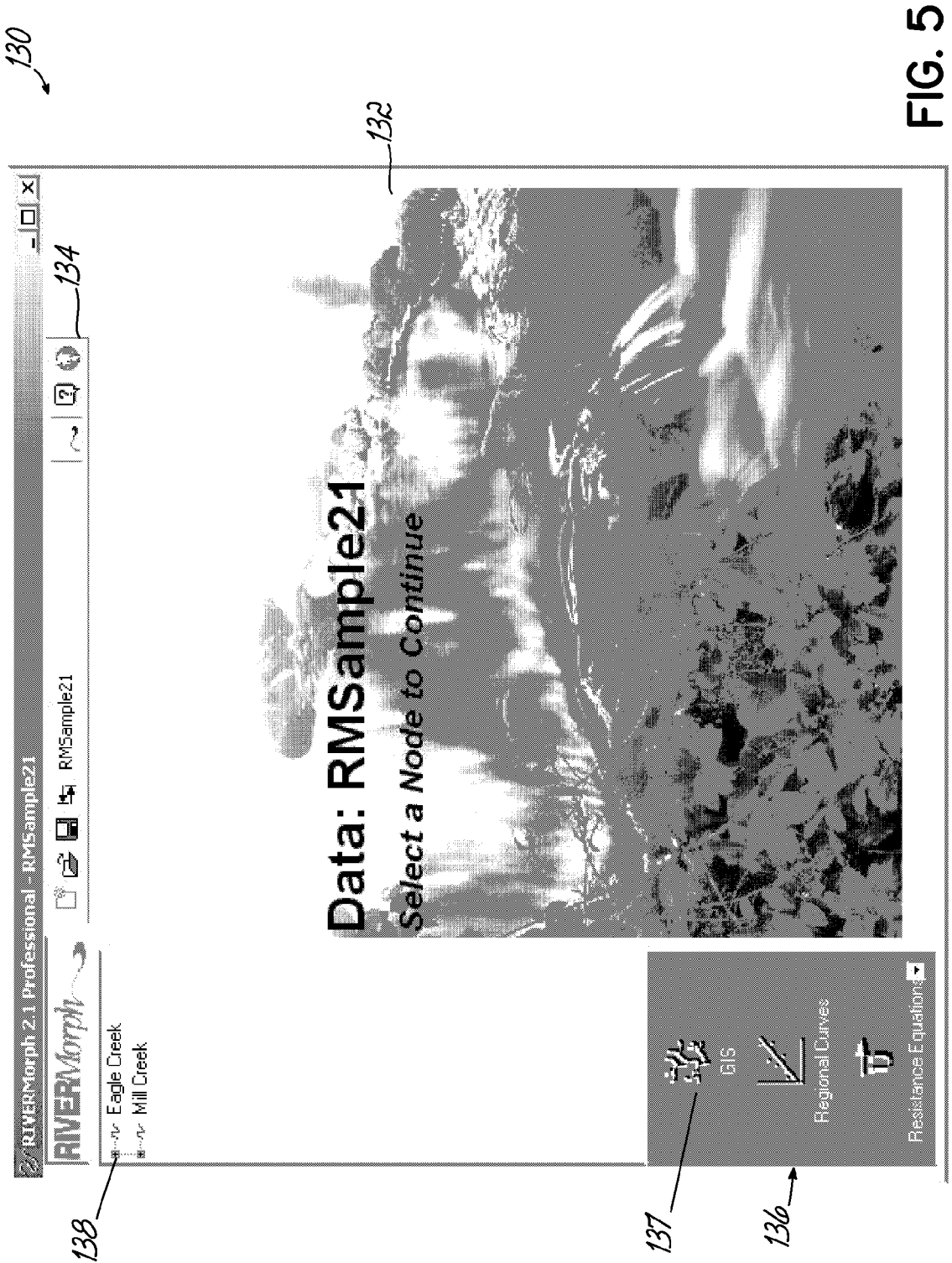
FIG. 5 is a browser window of a graphic user interface displayed by the processes of the flowchart of FIG. 4.

Turning more particularly to FIG. 5, an exemplary browser window 130 of a GUI configured to initially assist a user in obtaining channel design information is shown. More specifically, the browser window 130 illustrated in FIG. 5 may have particular application in connection with block 96 of FIG. 4. That is, the operating system 40 may initially display the browser window 130 of FIG. 5 to prompt user input relating to design information.

As illustrated in the embodiment of FIG. 5, the browser window 130 comprises a main window 132. The exemplary main window 132 may include a digital photograph, as shown, as well as other graphics and/or skins. Skins may include user interface settings such as background color. A database tree view 138 of FIG. 5 presents the user with mouse/click access to different layers of detail pertaining to a respective river. As discussed above in detail, channel data is stored under a number of categories, such as by river name, with all channel data being accessible through a data tree view 138 located in the left of the window 130 shown in FIG. 5. Links associated with new rivers, reaches and data sets are added within the data tree view as appropriate. A toolbar 134 of the browser window 130 assists the user in manipulating and navigating through available data and programs, as do the non-global tools shown in the toolbox 136 located beneath the tree view 138. These non-global tools shown in 136 may also be displayed in a drop down menu. For instance, selection of a GIS icon 137 in the main toolbox 136 may initiate a mapping display and associated tools configured to, in part, assist in determining reach data measurements.

Figure 6:
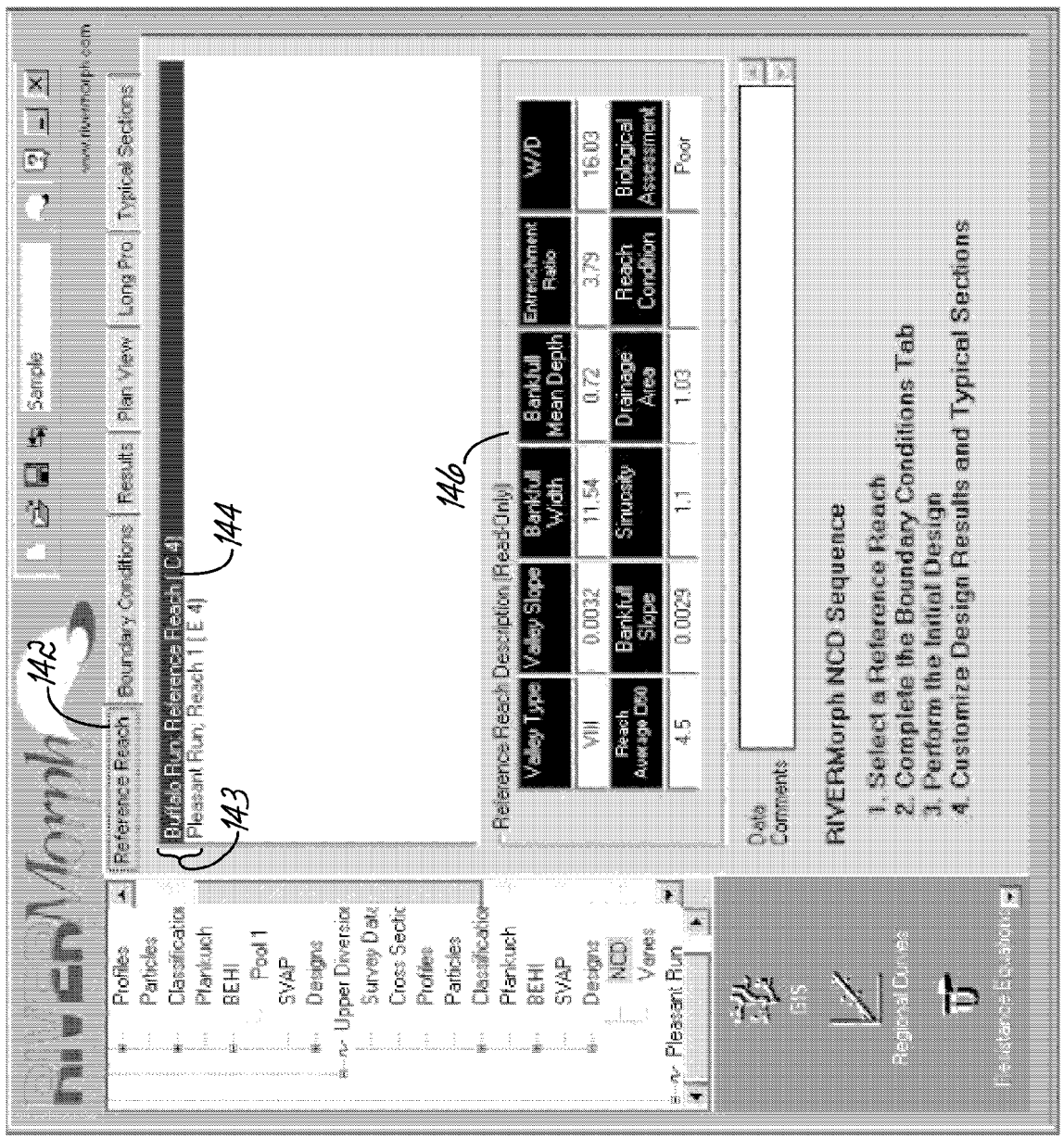
FIG. 6 is a browser window configured to process and store data used to develop reference reach data according to the processes of the flowchart of FIG. 4.

FIG. 6 includes an exemplary browser window 140 for loading reference reach data. Such reference reach data may be accessed using the database tree view 138 of the exemplary browser window 130 of FIG. 5. The exemplary browser window 140 of FIG. 6 may have particular application in the context of FIG. 11. Selection of a reference reach tab 142 of the browser window 140 of FIG. 6 initiates the display of a list 143 of reference reaches. As such, a user may click on or otherwise select a reference reach 144 from the list 143. Selection of the reference reach 144 causes applicable reference reach data to be automatically loaded in data fields 146 of FIG. 6. For instance, a user may cause cross-sectional data from an existing, stored reach data set to be automatically loaded by selecting the reference reach 144. That is, data from an existing cross-section may be retrieved by the operating system 40 to populate and/or to override cross-sectional data fields associated with a new reach.

Figure 7:
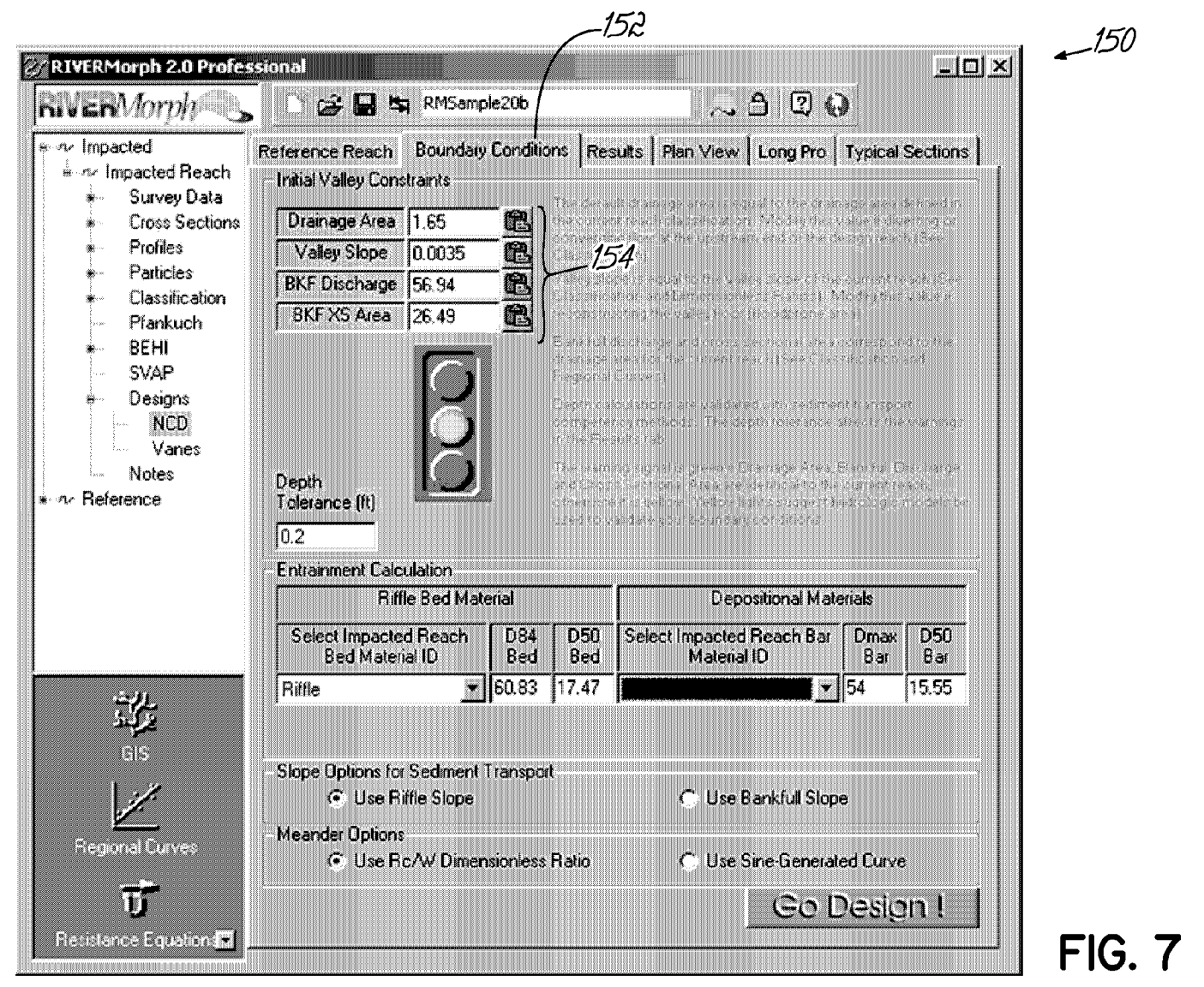

FIG. 7 shows an exemplary browser window 150 configured to receive channel data pertinent to a target, or an impact reach. Selection of a boundary tab 152 of FIG. 7 will allow the automatic or manual entry of boundary conditions in fields 154. Such conditions may include drainage area, valley slope, bankfull discharge and bankfull cross-section area, for instance. Each time the user changes a field, the operating system 40 checks all fields to see that they are all complete and valid. If they are not, then clicking the "Go Design Button" may generate a dialog box instructing the user to complete all of the data.

Figure 8:
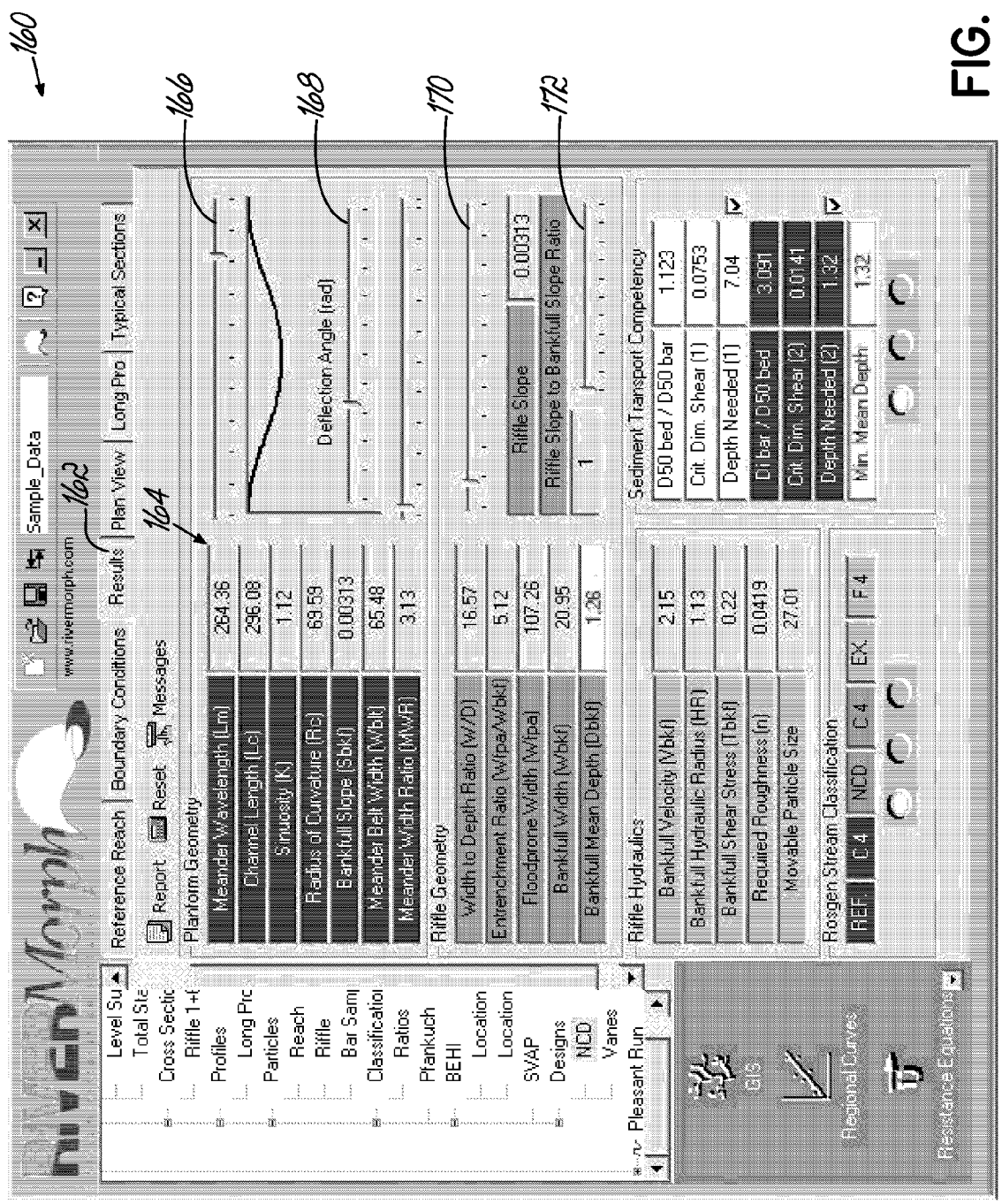
FIG. 8 is a browser window configured to communicate design information to a user as displayed by the processes of the flowchart of FIG. 4.

FIG. 8 shows an exemplary browser window 160 configured to communicate results to a user. Such results may include channel design information sought by the user. For instance, the user may select the results tab 162 of the browser window 160 to display data in field 164. Such channel information displayed in field 164 may be considered preliminary in the sense that the user may adjust certain fields using sliding bars 166, 168, 170 and 172. Adjustment in these slider bars may be necessary where the results do not fall within optimal channel depth or classification criteria. To this end, the displayed results may include indication of planform geometry, riffle geometry, riffle hydraulics, Rosgen stream classification data or other data appropriate for Natural Channel Design. For instance, if the background of the fields 164 as displayed are green, the design matches the reference reach and sufficient channel depth exists based on sediment transport competency equations. If the background is not green, then the user has to make a decision if he or she can live with the results. For example, the operating system 40 may warn the user with a yellow field if the design does not match the parameters of the reference reach within a specified tolerance. Adjusting the sliding scales 166, 168, 170 and 172 affects the numbers in the respective fields. Where so configured, the user may watch a display of a design change graphically in accordance with input design modifications and other changes made using a graphical display program. In a specific example, a user may layout a calculated meander pattern, then graphically manipulate the pattern. In another or the same example, measurements may be taken from the display of the graph to populate the database 37. The operating system 40 may warn the user if any geomorphic pattern parameters fall outside of an acceptable range.

Figure 9:
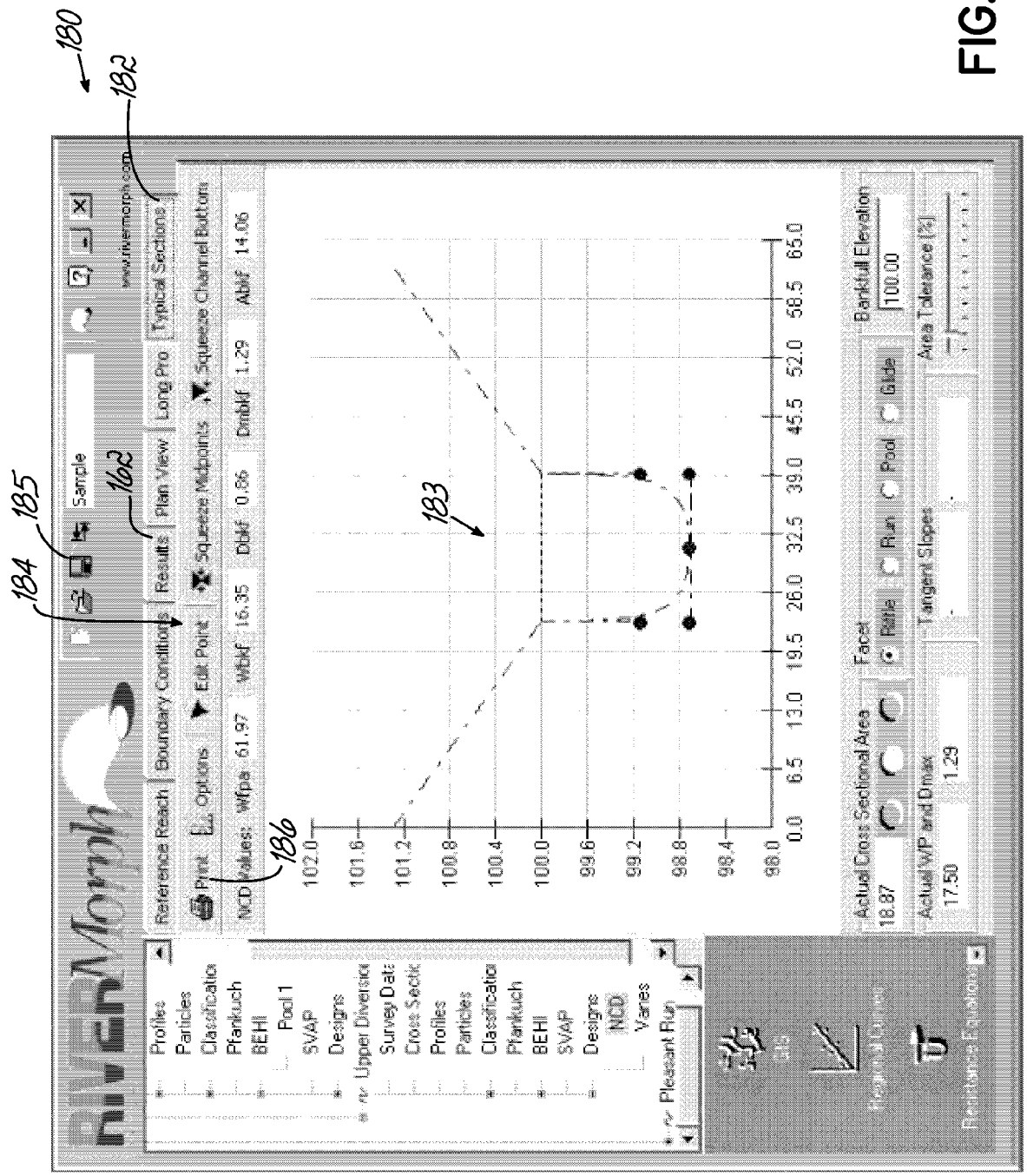
FIG. 9 is a browser window that includes graphical results of design information as formatted and displayed according to the processes of the flowchart of FIG. 4.

The exemplary browser window 180 of FIG. 9 shows one such graph of a displayed result. The browser window 180 includes a graph 183 showing the cross-section of a designed reach. Such a graph may be viewed when a user selects a typical sections tab 182. The user may manipulate the graph 183 using command buttons 184. The user may save a design and/or print using buttons 185 and 186, respectively, as needed.

Figure 12:
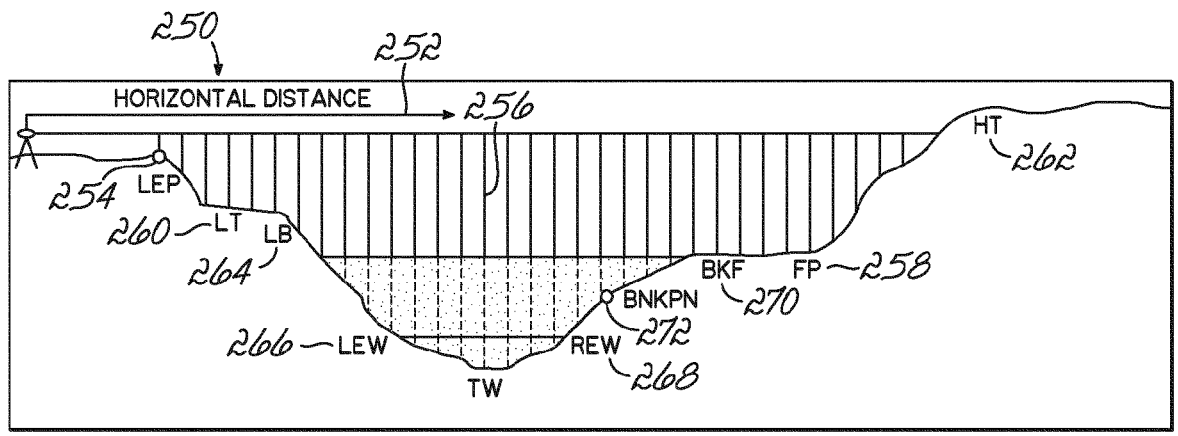
FIG. 12 is an exemplary cross section with standard notes of a stream or river.
Figure 13:
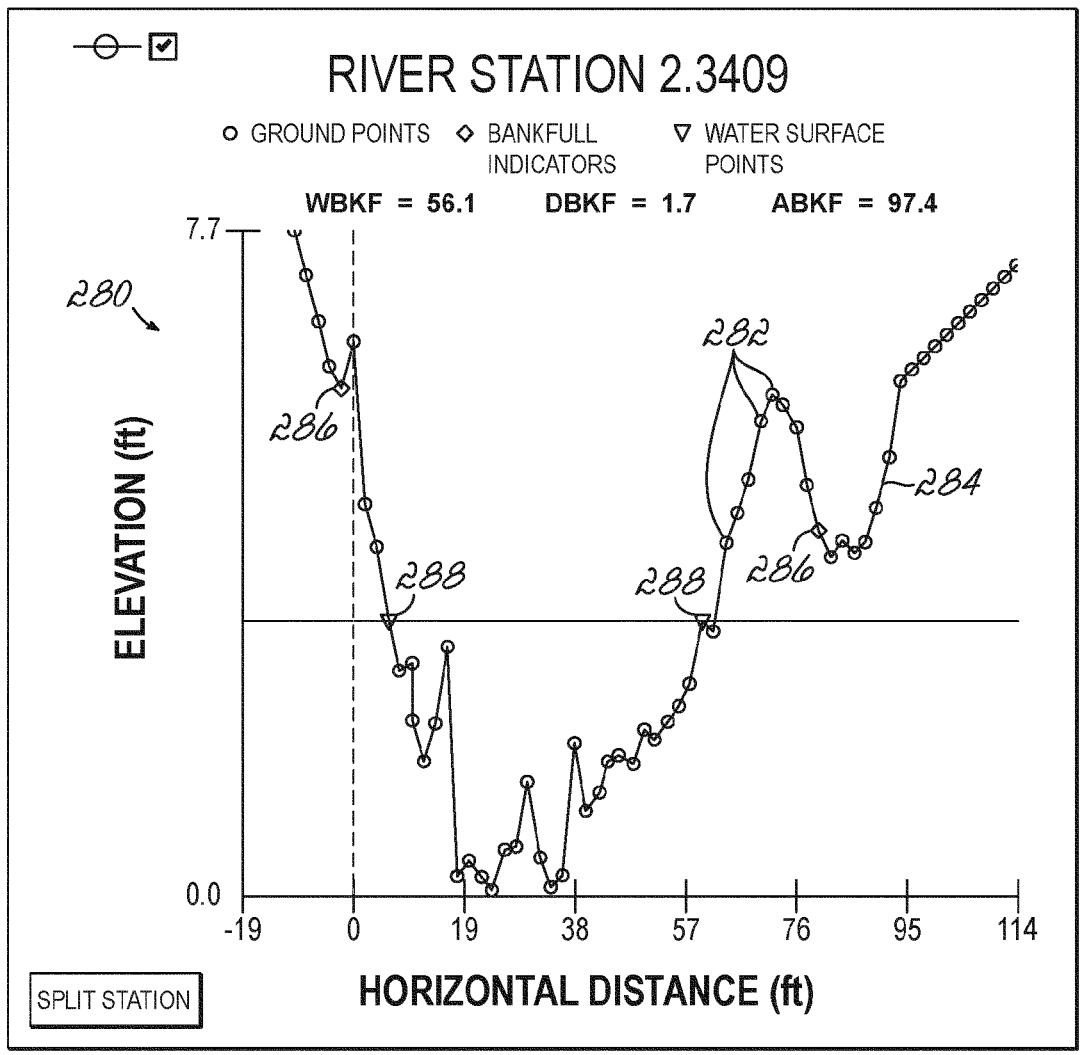
FIG. 13 is an exemplary graph of the cross section in FIG. 12, which may be displayed and manipulated in a browser window similar to FIGS. 5-10.

More particularly and with additional reference to FIGS. 12 and 13, cross sections may be used to measure many of the geomorphologic parameters in a given reach. Classification requires the use of at least one riffle cross section. Natural channel design works best when multiple cross sections are taken in a reference reach providing ranges of values for riffles, pools, runs and glides. Cross sections may be added, deleted, or renamed using, for example, a drop-down menu in the graphical user interface.

A cross section data grid may be used to expedite the process of converting unreduced survey data into a graph that may be used to calculate typical geomorphic properties. Alternatively, standard x,y data may be used. As cross sections are added, a type may be identified for each cross-section. In one embodiment the type is set to a default value of "riffle" if no other type is specified. The type may be changed by a user. Types may include, for example, Riffle, Pool, Run, and Glide. The type may be used to organize cross section data and to identify which data are applicable to stream classification and the development of dimensionless ratios.

In some embodiments, the cross section editor may be formatted to reduce survey field notes, such as those illustrated in the cross section 250 in FIG. 12, for a single instrument set-up, i.e. only one back-site per cross section. In other embodiments, the cross section editor may be configured to reduce field notes taken with differential leveling field techniques, which requires a bench mark elevation (BM) and back-site (BS) rod reading.

The cross section data grid may contain three numeric columns and one alpha-numeric column. In one embodiment, the data grid may contain the horizontal distance from the Left End Pin (LEP) 254 or "zero stake" for each rod reading, the foresight or rod reading which may be measured with a survey staff for example, the elevation of the point if using standard x-y data, and an optional description for each rod reading (or elevation). The optional description may be in the form of notes which may be selected from a standard set of notes including: BM—Benchmark, FS—Foresight, BS—Backsight, WS—Water Surface, FP—Floodplain 258, LT—Low Terrace 260, MT—Middle Terrace, HT—High Terrace 262, LB—Left Bank 264, RB—Right Bank, LEW—Left Edge of Water 266, REW—Right Edge of Water 268, CL—Centerline of Channel, PB—Point Bar, BKF—Bankfull Indicator 270, SB—Stream Bed, LEP—Left End Pin, REP—Right End Pin, and BNKPN—Bank Pin 272. An exemplary cross section 250 with standard notes 252-272 is shown in FIG. 12.

A commonly used hydraulic model in the United States for analyzing one-dimensional steady and unsteady water surface profiles is the United States Army Corps' HEC-RAS model (and its predecessor HEC-2). This model is developed independently by the Hydrologic Engineering Center in Davies, Calif. Cross section data from this model may be imported, or cross sectional may be exported to the model.

The cross section graph is a plot 280 of the points 282 that were entered as seen in the graph in FIG. 13. The cross section graph shows not only the graph of the cross section 284, but also bankfull points 286 and water surface elevation points 288 on the graph. The graph may also be designed to interact with hydraulic calculations. In some embodiments, cross sections may be divided into a "left" and "right" so that calculations may be subdivided in a cross section summary page.

In addition to the graphical representation, a summary page may be utilized to show typical geomorpholgic calculations for a cross section channel and the left and right subportions. The calculations may be based on the bankfull elevation and split station specified on the graph. This page may provide a table of computed results for: Floodprone Elevation, Bankfull Elevation, Floodprone Width, Bankfull Width, Entrenchment Ratio, Mean Depth, Maximum Depth, Width/Depth Ratio, Bankfull Area, Wetted Perimeter, and Hydraulic Radius.

Similar to cross sections, profile survey data may be reduced to assist in measuring lengths, depths and slopes from a profile graph. Profiles may be added, deleted, or renamed by, for example, selecting the function from a drop-down menu in the graphical user interface.

Profile data may be entered one of two ways: by entering rod readings directly from field notes, with elevations being automatically calculated, or by entering elevations that were calculated elsewhere. The profile data entry grid may contain the following columns:

| Column Heading | Data Description |
| --- | --- |
| DIST | Distance along the channel thalweg usually measured with increasing values in the downstream direction from some arbitrary zero stake (feet) |
| CH | Rod readings/elevations obtained in the channel thalweg (feet) |
| WS | Water depths or rod readings/elevations obtained at the water surface |
| BKF | Rod readings/elevations obtained at bankfull indicators such as the top of point bars, breaks in slope, change in vegetation or change in bank materials from coarse to fine sediments |
| P1 | Rod readings/elevations obtained along a user-defined feature (feet) |
| P2 | Rod readings/elevations obtained along a user-defined feature (feet) |
| P3 | Rod readings/elevations obtained along a user-defined feature (feet) |
| P4 | Rod readings/elevations obtained along a user-defined feature (feet) |
| NOTE | Note field. |

The profile data grid may be designed to expedite the process of converting unreduced survey profile data into a graph that can be used to calculate typical geomorphic properties, such as maximum bankfull depth, water facet slopes and pool-to-pool spacing. For the calculation of elevations from rod readings, a bench mark elevation and a backsite rod reading need to be supplied. Water surface data may be supplied as either water depth measurements, or the elevation of the water surface may be calculated by subtracting the rod reading from the height of the instrument (BM elevation+BS reading). Cross section names may be listed in the current reach in a table below the profile data entry grid. A profile station may be added for each cross section so that the cross section locations will be visible on the profile graph.

The longitudinal profile graph may also be interactive. The graph's measuring tool may be used to interactively populate the slopes, lengths and depths data. In some embodiments, the profile may plot the channel thalweg with a black line and markers and the low-flow water surface with a blue line and markers. Other series, or columns from the profile data entry grid may be plotted as markers only. Similar to the cross section plots above, any profile(s) in the current project file may be selected to overlay on top of the current profile. Additionally, a list of all cross sections within the active reach is located in the bottom right corner of the profile graph. As each cross section is checked, a vertical line is placed on the graph at the location specified above. The longitudinal profile editor allows for storage up to 500 turning points.

Figure 10:
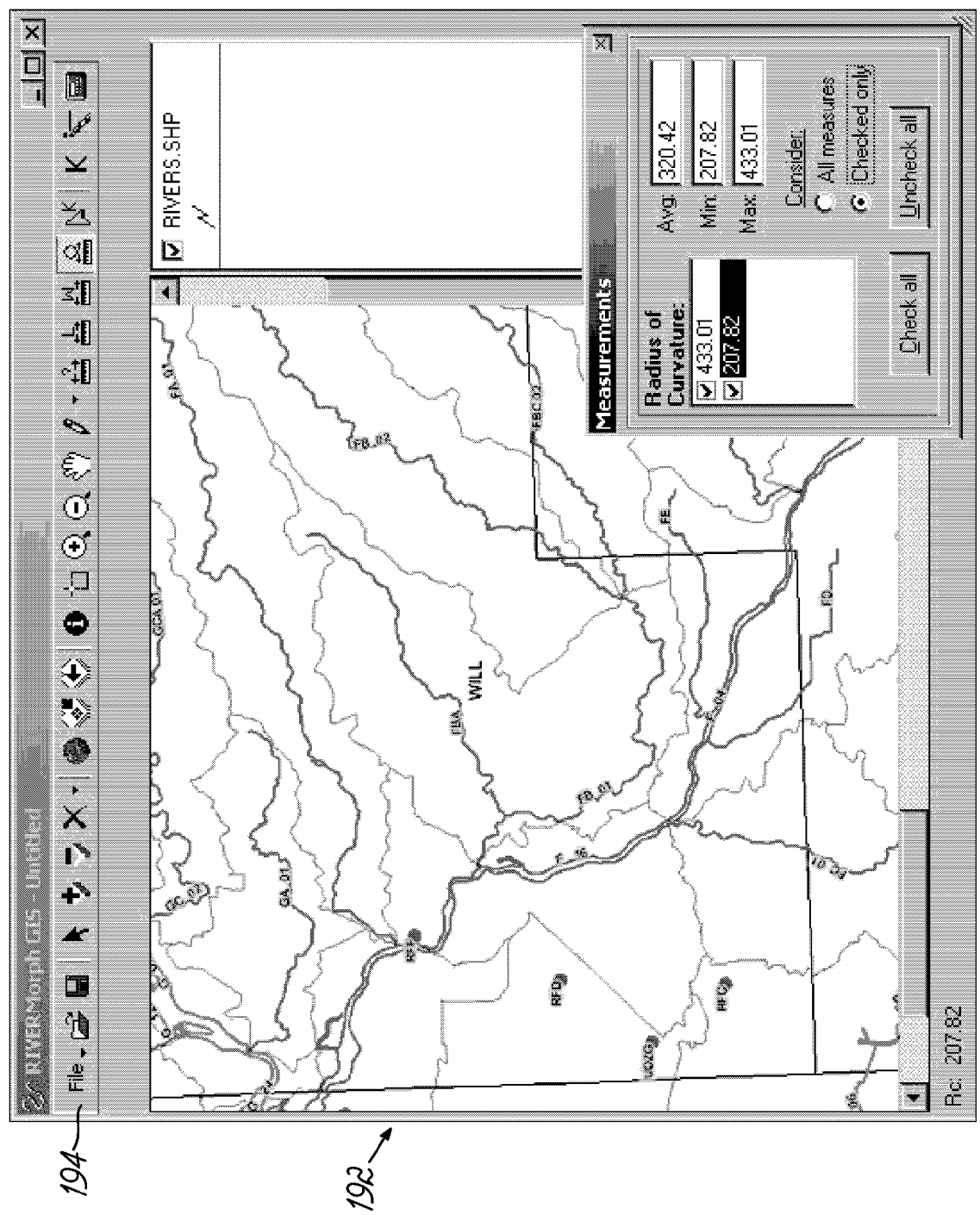
FIG. 10 is a browser window that includes GIS mapping graphics displayed according to the processes of the flowchart of FIG. 4.

The exemplary browser window 190 of FIG. 10 includes a map view 192 as may be generated by the above discussed GIS program. The GIS toolbar 194 allows a user to zoom, print and measure geomorphic features shown in the map view, among other options. For instance, GIS programming linked to the GUI may include tools for measuring thalweg, radius of curvature, sinuosity and meander wavelength of a particular reach or other measurements. Such measurements are generally indicative of the dimensions of a bend or series bends in a river, for instance. In a specific example, a user may construct points or lines useful in measuring distances off of the map 192 by clicking on the GIS image with a mouse. For instance, to draw a straight line, the user clicks once on the location of one of the line's endpoints, then drags the line to the location of another endpoint. The user may then double-click to create the desired line. A black line will appear on the display, superimposed against the map in that location. Channel data comprising the length of that line is then presented or otherwise made available to the user.

In similar fashion, a user may measure beltwidth and meander wavelength, for instance, as well as sinuosity and radius of curvature using the GIS features. As discussed herein, such measurement data may be automatically and/or manually used to populate the database. Other button and mouse functions known in the art may allow easy measurement of curves and river dimensions.

Figure 11:
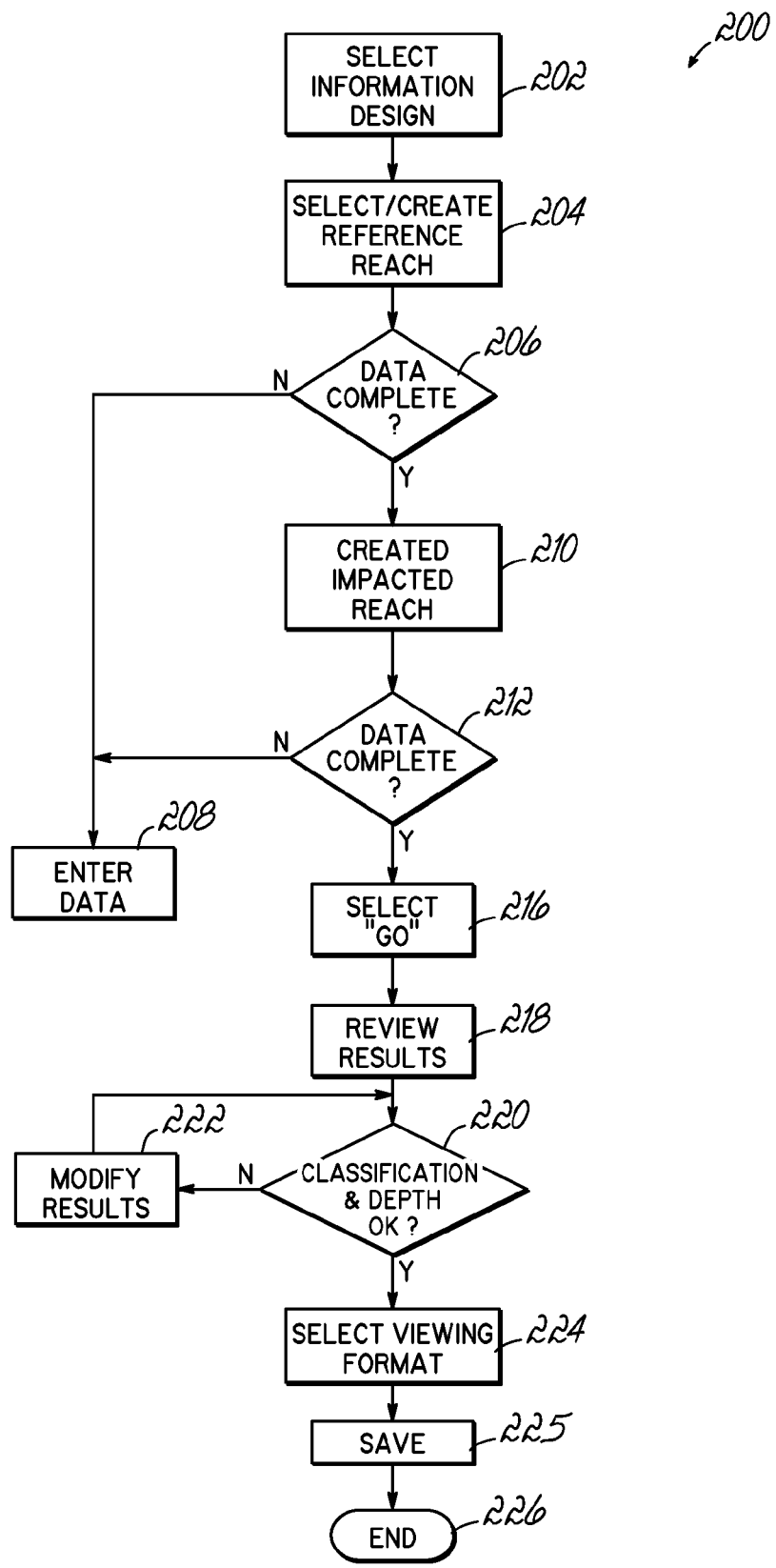
FIG. 11 is a flowchart including steps taken by a planner using the computer of FIG. 2 to determine a channel design feature.

The flowchart 200 of FIG. 11 shows exemplary method steps suited for determining channel design information, such as a Natural Channel Design. The steps of the flowchart 200 are shown from the perspective of a user interacting with the hardware and software of FIG. 3. Turning to block 202 of FIG. 11, the user may select a design feature button of a GUI, which initiates a process to establish a Natural Channel Design. The selection of the design button at block 202 may cause the user to be further prompted at block 204 of FIG. 11 for reference reach data. As discussed herein, such reference reach data has particular application in realizing a Natural Channel Design.

In providing the prompted reach channel data, a user may select a displayed reference reach field 144, such as is shown in the exemplary browser window 140 of FIG. 6. Selection of the field 144 causes appropriate data to automatically populate the data channel field 146. However, where required channel data is determined at block 206 of FIG. 11 to be missing from the automatically imported channel data, then the user may otherwise cause that data to be entered at block 208. Practices available to the user to load the data at block 208 may include cut and paste techniques using channel data from other databases and sources. Other techniques may include using features of the mapping tool, as shown in FIG. 10.

Where the data is alternatively complete at block 206, the user may cause impact reach channel data to be entered at block 210 of FIG. 11. Entry of data at block 210 may be made into a browser window 150 such as is shown in FIG. 7. As with the reference reach data, the user may have to complete any missing data at block 208. Where all the data needed to determine a design feature is present at block 212, the user may select a "Go Design" button at block 216.

After selecting the button at block 216 of FIG. 11, the user may then review the initial results, or initial channel design at block 218. For instance, the browser window 160 of FIG. 8 may be viewed by the user at block 218 of FIG. 11. Where the classification and calculated depth is not within predefined classification or depth parameters or is otherwise unacceptable to the user at block 220, the user may tweak the results at block 222. For instance, the user may type in new data or adjust the slide scale mechanisms 166, 168, 170 and 172 to adjust and otherwise optimize a channel design.

Where the classification of the results is acceptable at block 222, the user may select a different format in which to view the results at block 224. For instance, the user may view a number of different graphical displays, such as the graph 183 shown in FIG. 9, to gain a different perspective or additional design information. The user may make changes to the text, background, legend, axis and labels of a graph where desired. Prior to ending a design process at block 226, the user may save the optimized channel design information at block 225.

In operation, a user may select the impact reach, reference reach and regional curve from a database and sets up a new natural channel design. For instance, a user may enter reference reach data via the GUI and select a tool to process the data to execute Natural Channel Design operations. In turn, the program code initiates the display of determined channel dimensions and creates cross-section and profile summaries that may be viewed by the user. Meander geometry is plotted using sign-generated functions for each meander wavelength or may be based on a ratio of radius of curvature to bankfull width. The program code further includes a regional curve application viewable in a drop down menu. User collected data is automatically entered into a table. The software then displays the new regional curve equation and statistical parameters letting the user know the quality of the fitted curve. The program code 43 further calculates riffle shear stress velocities according to known equations. The new channel design may be stored in association with a reach in the database. In developing the channel design information, the user may set site constraints, such as desired dimensions, flows and other parameters comprising input channel data measurements. After determining the natural channel design, the natural channel design dimensions, classification results, pebble count, cross-section and profile data may be viewed, adjusted, stored, shared and/or printed by the user.

The program code uses the Rosgen Stream Classification System[1,2] to classify streams and rivers. Data for classification may be directly typed in or may be populated from ratios calculated by the program code. The GUI may include a classification screen toolbar containing the following tools: Report, generate a text report of the current classification data set; Refresh, refresh the data fields with the average values taken from the dimensionless ratios screen; Get D50, extract a D50 from the selected particle size distribution listed in a Reach Pebble Count; Classify, force reclassification of the reach based on the current input values; and Reset Sliders, reset the entrenchment ratio adjustment and width to depth ratio adjustment sliders to the default zero values.

[1]D. L. Rosgen. A classification of natural rivers, *Catena*, 22. Elsevier Science B.V., 1994. 169-199.
[2]D. L. Rosgen. *Applied River Morphology*. Minneapolis: Printed Media Companies, 1996.

Most of the data may be entered by first completing a dimensionless ratios form and then using the refresh tool on the classification tool bar. Values may also be typed directly into the classification screen. Classification data may be divided into groups of Valley Morphology, Location and Date of Survey, and Bankfull Channel Data.

Valley Morphology data includes a Valley Type selected from detailed descriptions of valley types, defined in *Applied River Morphology* by Dave Rosgen. The Valley Slope (ft/ft) is a measurement of the valley slope taken during the reach survey. This value may also be calculated if bankfull slope and sinuosity are known. The Drainage Area (sq mi) is the drainage area in square miles.

Location and Date of Survey includes the State and County. A latitude of the upstream starting point of the reach may be supplied in decimal degrees or converted from degrees-minutes-seconds (DMS) to decimal degrees. A longitude: may be entered similar to Latitude above. The date that the reach data was collected may also be entered.

The Bankfull Channel Data or Riffle Cross Section data may include a selection of single thread or multiple channels. Width of the bankfull surface width may be entered in feet. Mean Depth of the bankfull mean depth may be entered in feet. The mean depth may be calculated if the width and cross sectional area data has been supplied. The Flood-Prone Width may be entered in feet.

The Channel Materials D50 may be selected from a pre-loaded list of particle size distribution data that has a "Reach"

data type. Reach average pebble counts are most commonly used to define the type of channel with respect to channel materials (bedrock, boulder, cobble, gravel, sand, or silt/clay). The water surface slope is entered at bankfull (dimensionless or ft/ft). The Sinuosity is the stream's sinuosity measurement. The sinuosity of the river may be calculated if valley slope and water surface slope have been measured accurately. Discharge is entered in cubic feet per second. Velocity is the average bankfull velocity in feet per second. The Cross Sectional Area is the bankfull cross sectional area in square feet. The cross sectional area may be calculated if Width and Mean Depth are known.

An Entrenchment Ratio may be calculated automatically by the program code. This value is defined by Flood-Prone Width/Width. A Width to Depth Ratio may also be calculated automatically by the program code. This value is defined by Width/Mean Depth. Bedrock Control may also be identified for the classification.

As the required data is being entered into the appropriate fields, the program code may be checking for the critical data needed to perform a stream classification (Entrenchment Ratio, Width/Depth Ratio, Sinuosity, Slope and Channel Materials). Once these values have been entered, the program code performs a stream classification and displays the result, along with a representative sketch of the stream type. The program code may reclassify the data based on adjustments made to the Entrenchment Ratio Adjustment and to the Width to Depth Ratio Adjustment. In some embodiments these adjustments may be made using slider bars in the GUI.

While the present invention has been illustrated by a description of various embodiments and while these embodiments have been described in considerable detail, it is not the intention of the applicants to restrict or in any way limit the scope of the appended claims to such detail. For instance, while embodiments consistent with the present invention may have particular application in the context of Natural Channel Design stream assessment and stream monitoring, one skilled in the art will appreciate that principles of the present invention are equally applicable to other water design processes. Additional advantages and modifications will readily appear to those skilled in the art. One skilled in the art will appreciate that these Figures represent an example of the content contained in Applicants' system, and that the system contains additional screens and functionality. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A computer implemented method for assessing a stream channel cross section, the method comprising:
   receiving cross-sectional data defining stream channel geometry;
   identifying geomorphic properties within the data defining the stream channel geometry;
   graphically displaying the cross-sectional data of the stream channel geometry;
   interactively changing a geomorphic property of the cross-sectional data;
   analyzing the change in geomorphic properties of the cross section by adjusting geomorphic parameters; and
   updating the graphical display,
   wherein the cross-sectional data is derived from reducing survey field notes having bench mark elevation and back-site rod readings.

2. The method of claim 1 wherein the cross-sectional data is derived from standard X,Y data pairs.

3. The method of claim 1 wherein receiving cross-sectional data defining the stream channel geometry comprises:
   importing the cross-sectional data from an outside source.

4. The method of claim 1 wherein identifying geomorphic properties within the data defining the stream channel geometry comprises:
   associating a description for selected data defining the stream channel geometry, the description selected from a group consisting of: benchmark, foresight, backsight, water surface, floodplain, low terrace, middle terrace, high terrace, left bank, right bank, left edge of water, right edge of water, centerline of channel, point bar, bankfull indicator, stream bed, left end pin, right end pin, and bank pin.

5. The method of claim 1 wherein interactively changing the geomorphic property comprises:
   graphically moving the geomorphic property on the graphical display.

6. The method of claim 1 wherein the cross-section data is first cross sectional data defining the stream channel geometry at a first location, the method further comprising:
   receiving second cross-sectional data defining a stream channel geometry at a second location spaced from the first location;
   identifying geomorphic properties within the second cross-sectional data defining the stream channel geometry;
   graphically displaying the second cross-sectional data of the stream channel geometry;
   interactively changing a geomorphic property of the second cross-sectional data;
   analyzing the change in geomorphic properties of the second cross section by adjusting geomorphic parameters; and
   updating the graphical display.

7. The method of claim 6 wherein the graphical display of the second cross-sectional data is overlaid on the graphical display of the first cross-sectional data.

8. The method of claim 1, further comprising:
   adding profile station data for the cross-sectional data to longitudinal data defining a stream channel profile; and
   graphically displaying the profile station data on a graph of the longitudinal data defining the stream channel profile.

9. The method of claim 8, further comprising:
   adding second profile station data for second cross-sectional data to the longitudinal data defining the stream channel profile; and
   graphically displaying the second profile station data on the graph of the longitudinal data defining the stream channel profile.

10. The method of claim 8, further comprising:
    identifying additional geomorphic properties within the longitudinal data defining the stream channel profile;
    graphically displaying the additional geomorphic properties within the longitudinal data of the stream channel profile;
    interactively analyzing properties of the profile by graphically measuring the properties;
    storing the measured properties; and
    outputting a summary of the stored measured properties.

11. A computer implemented method for assessing a stream channel profile, the method comprising:
    receiving longitudinal data defining the stream channel profile;

identifying geomorphic properties within the data defining the stream channel profile;

graphically displaying the longitudinal data of the stream channel profile;

interactively analyzing properties of the profile by graphically measuring the properties;

storing the measured properties; and outputting a summary of the stored measured properties, wherein the analyzed properties are selected from a group of geomorphic features consisting of: slopes, depths, lengths and combinations thereof, and wherein the geomorphic features are selected from a group consisting of: a riffle, a pool, a run, a glide, and combinations thereof.

12. The method of claim 11 wherein the longitudinal data is first longitudinal data defining the stream channel profile at a first location, the method further comprising:

receiving second longitudinal data defining a stream channel profile at a second location spaced from the first location;

identifying geomorphic properties within the second longitudinal data defining the stream channel profile;

graphically displaying the second longitudinal data of the stream channel profile;

interactively analyzing properties of the second longitudinal data of the profile by graphically measuring the properties;

storing the measured properties; and outputting a summary of the stored measured properties.

13. The method of claim 12 wherein the graphical display of the second longitudinal data is overlaid on the graphical display of the first longitudinal data.

14. The method of claim 11 further comprising:

identifying a location of a cross section within the second longitudinal data defining the stream channel profile; and associating the cross section with the identified location.

15. The method of claim 14 further comprising:

graphically displaying the cross section at the identified location on the graphical display of the longitudinal data of the stream channel profile.

* * * * *

UNITED STATES PATENT AND TRADEMARK OFFICE
CERTIFICATE OF CORRECTION

| | | |
|---|---|---|
| PATENT NO. | : 7,797,143 B2 | Page 1 of 1 |
| APPLICATION NO. | : 12/027656 | |
| DATED | : September 14, 2010 | |
| INVENTOR(S) | : Brian J. Belcher et al. | |

It is certified that error appears in the above-identified patent and that said Letters Patent is hereby corrected as shown below:

Column 1, line 20, change "operations, and more particularly, to" to --operations and, more particularly, to--.

Column 2, line 26, change "convention design processes" to --conventional design processes--.

Column 3, line 49, change "accompanying drawing" to --accompanying drawings--.

Column 13, line 36, change "Davies, Calif." to --Davis, Calif.--.

Column 13, line 49, change "geomorpholgic" to --geomorphologic--.

Column 15, line 66, change "sets up" to --set up--.

Signed and Sealed this
Fourth Day of January, 2011

David J. Kappos
*Director of the United States Patent and Trademark Office*

UNITED STATES PATENT AND TRADEMARK OFFICE
CERTIFICATE OF CORRECTION

PATENT NO. : 7,797,143 B2
APPLICATION NO. : 12/027656
DATED : September 14, 2010
INVENTOR(S) : Brian J. Belcher et al.

Page 1 of 1

It is certified that error appears in the above-identified patent and that said Letters Patent is hereby corrected as shown below:

Title Page, (73) Assignee, change "FMSM Engineers, Inc., Louisville, KY (US)" to
--Stantec Consulting Services Inc., Edmonton, Alberta (CA)--.

Signed and Sealed this
Thirty-first Day of May, 2011

David J. Kappos
*Director of the United States Patent and Trademark Office*